(12) United States Patent
Hildebrant

(10) Patent No.: US 7,100,098 B2
(45) Date of Patent: Aug. 29, 2006

(54) SYSTEMS AND METHODS FOR TESTING PERFORMANCE OF AN ELECTRONIC DEVICE

(75) Inventor: Andrew Steven Hildebrant, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 496 days.

(21) Appl. No.: 10/461,252

(22) Filed: Jun. 12, 2003

(65) Prior Publication Data

US 2004/0255214 A1    Dec. 16, 2004

(51) Int. Cl.
*G06F 11/00* (2006.01)
(52) U.S. Cl. ........................ 714/738; 714/718
(58) Field of Classification Search .............. None
See application file for complete search history.

(56) References Cited

U.S. PATENT DOCUMENTS

| | | | | | |
|---|---|---|---|---|---|
| 4,775,977 | A | * | 10/1988 | Dehara | 714/736 |
| 5,142,223 | A | * | 8/1992 | Higashino et al. | 714/724 |
| 5,293,080 | A | * | 3/1994 | Hiwada et al. | 327/141 |
| 5,453,995 | A | * | 9/1995 | Behrens | 714/743 |
| 5,930,271 | A | * | 7/1999 | Takahashi | 714/738 |
| 6,412,087 | B1 | * | 6/2002 | Matsumoto | 714/738 |
| 6,484,282 | B1 | * | 11/2002 | Tsuto | 714/738 |
| 6,769,083 | B1 | * | 7/2004 | Tsuto et al. | 714/738 |
| 2003/0110427 | A1 | * | 6/2003 | Rajsuman et al. | 714/724 |

* cited by examiner

*Primary Examiner*—Guy Lamarre
*Assistant Examiner*—John P. Trimmings

(57) ABSTRACT

A method for testing performance of a device-under-test (DUT) includes: examining vectors, each of the vectors including a plurality of characters; and creating waveform entries, each of the waveform entries corresponding to a distinct vector configuration encountered among the vectors examined.

19 Claims, 7 Drawing Sheets

SYSTEMS AND METHODS FOR TESTING PERFORMANCE OF AN ELECTRONIC DEVICE

BACKGROUND

Testing the performance of a digital device, such as, for example, a microprocessor, typically requires providing the device with input and then checking the device's output to determine if it is correct. The device under test (DUT) may be provided with a sequence of waveforms, each of which represents a certain number of state characters.

A testing device that provides multi-character waveforms to a DUT may include a waveform table having a number of waveform entries. Each waveform entry describes a waveform that may be provided to or received from the DUT. The testing device may also include a memory device (known as vector memory) for storing vectors corresponding to DUT input and/or predicted DUT output.

Using multi-character waveforms to provide input to a DUT or to test the output of the DUT enables the vector memory requirement to be reduced by a factor of N (where N is the number of characters represented by each waveform). For example, consider a stream of state characters HHLL where each character corresponds to a waveform entry in a waveform table. These state characters will occupy four memory locations in the vector memory (one memory location per character). However, if a multi-character waveform entry corresponding to the characters HHLL is stored in the waveform table, then the entire stream of state characters HHLL can be stored in a single vector memory location in the waveform table, thereby reducing memory requirements.

Using vectors comprising N state characters can also virtually increase the speed of the tester by a factor of N. For example, consider a tester having a minimum base period of 4 ns (250 MHz), where one vector is delivered per tester cycle. If each vector were to only contain one state character and were to reference a waveform representing a single data event, then the maximum event delivery speed (to a DUT) is 250 MHz. However, if each vector were to contain four state characters and were to reference a waveform representing four data events, then the maximum event delivery speed becomes 1 GHz.

One problem encountered in using multi-character vectors is that the number of possible waveform entries may exceed the storage capacity of the waveform table. For example, a file comprising DUT input and projected DUT output may include five distinct input/output timeplates, each of which has five distinct values (e.g., H, L, X, 1, or 0). In such an example, if each waveform represents three state characters, then there would be over 30 billion possible waveform entries that can represent any combination of three state characters in such file ( ( ( 5 timeplates) ^ 5 states ) ^ 3 state characters)). In order to successfully use the testing device, only a small number (e.g., 32 or less) of the possible waveform entries may be specified in the waveform table. Therefore, to operate within a tester's limits, a user has had to eliminate combinations of characters that are unlikely to be encountered in test data. This process of elimination can be very difficult and time consuming, especially when timing information for the test data is developed separately from the corresponding vector information.

One possible approach for dealing with this problem is to adopt standard masking templates. These templates force data combinations to fit within tester resources, often by ignoring valid DUT output. While this approach requires less user effort, it also destroys the integrity of the DUT testing.

Another possible approach for solving this problem is to provide a testing device with much larger memory capacity that can accommodate a waveform table having many more waveform entries. However, this is not a cost effective solution since the high speed memory required for many testing devices is relatively expensive. Therefore, there exists a need for systems and methods for addressing this and/or other problems associated with testing digital devices.

SUMMARY

An embodiment of a method for testing performance of a device-under-test (DUT) includes: examining vectors, each of the vectors including a plurality of characters; and creating waveform entries, each waveform entry corresponding to a distinct vector configuration encountered among the vectors examined.

A system for testing performance of a DUT includes a memory device and a processor. The memory device stores vectors, each of which includes multiple characters. The processor is programmed to examine the vectors and to create waveform entries. Each waveform entry describes a distinct vector configuration encountered among the examined vectors.

Other systems, methods, features and/or advantages will be or may become apparent to one with skill in the art upon examination of the following figures and detailed description. It is intended that all such additional systems, methods, features, and/or advantages be included within this description and be protected by the accompanying claims.

BRIEF DESCRIPTION OF THE DRAWINGS

In the drawings, like reference numerals designate corresponding parts throughout the several views. Furthermore, the components in the drawings are not drawn to scale.

DETAILED DESCRIPTION

As will be described in more detail below, a method for testing performance of a device-under-test (DUT) includes examining multi-character vectors, and creating waveform entries identifying distinct vector configurations encountered among the vectors examined. These waveform entries may be stored in a waveform table corresponding to a DUT pin. The waveform table may then be used to generate waveforms used in testing DUT performance. A plurality of waveform tables may be used to generate respective waveforms corresponding to respective DUT pins.

Figure 1:
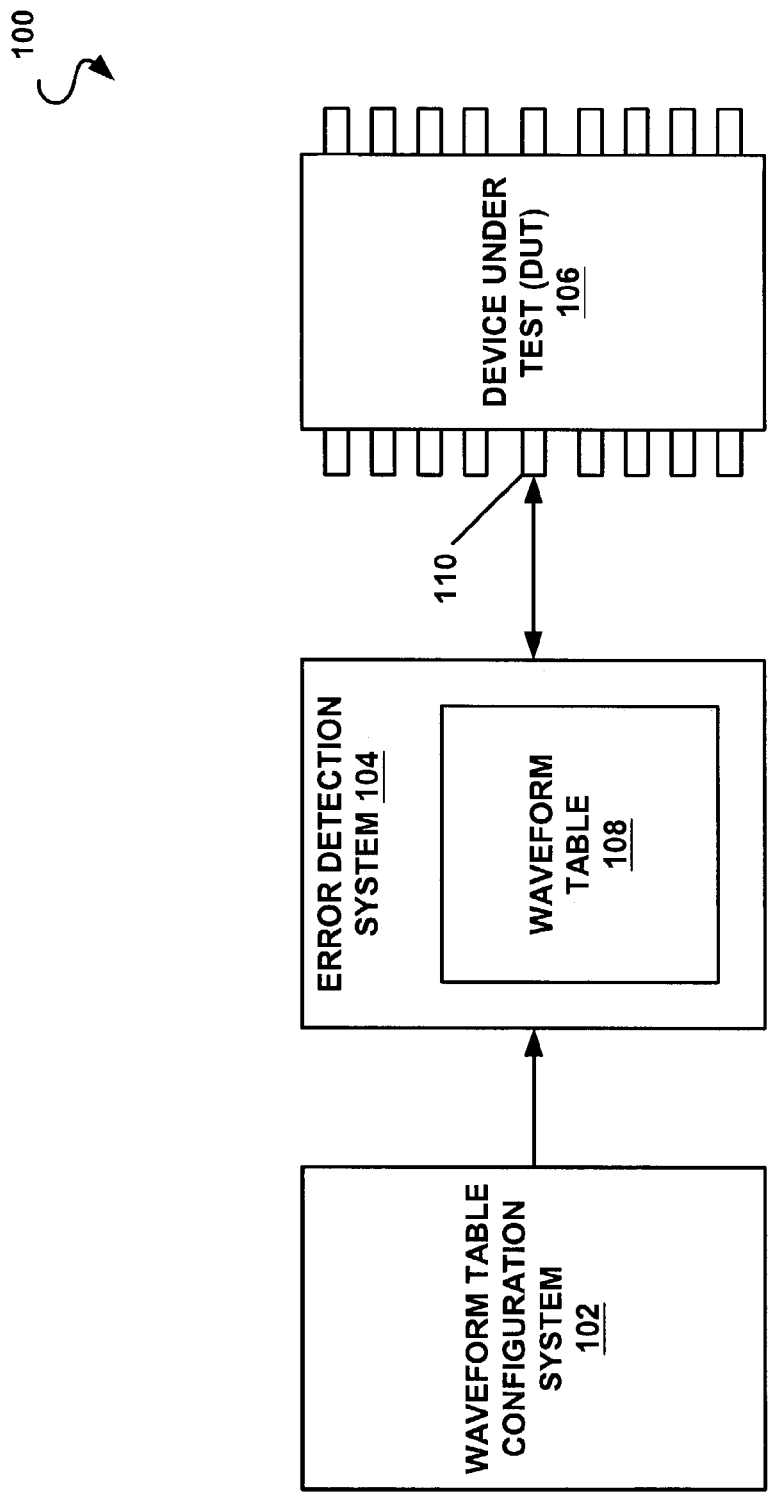
FIG. 1 is a block diagram depicting an embodiment of a testing system.

FIG. 1 is a block diagram depicting an embodiment of a testing system 100. The testing system 100 includes an error detection system 104 coupled to a DUT pin 110. The error detection system 104 is used to detect errors in the operation of the DUT 106 by providing input to and/or receiving output from the DUT pin 110. The DtTT 106 may be, for example, a processor or other digital device that receives and outputs digital signals. The error detection system 104 includes a waveform table 108 that is used in providing test data to the DUT 106. The waveform table 108 includes waveform entries that define respective waveforms. The waveform table configuration system 102 is used to configure the waveform table 108. The waveform table configuration system 102 may be a specific or general purpose computer including, for example, a desk-top computer, a lap-top computer, or a main-frame computer, among others. In an alternative embodiment, the functionality of the waveform table configuration system 102 may be incorporated into the error detection system 104.

Figure 2:
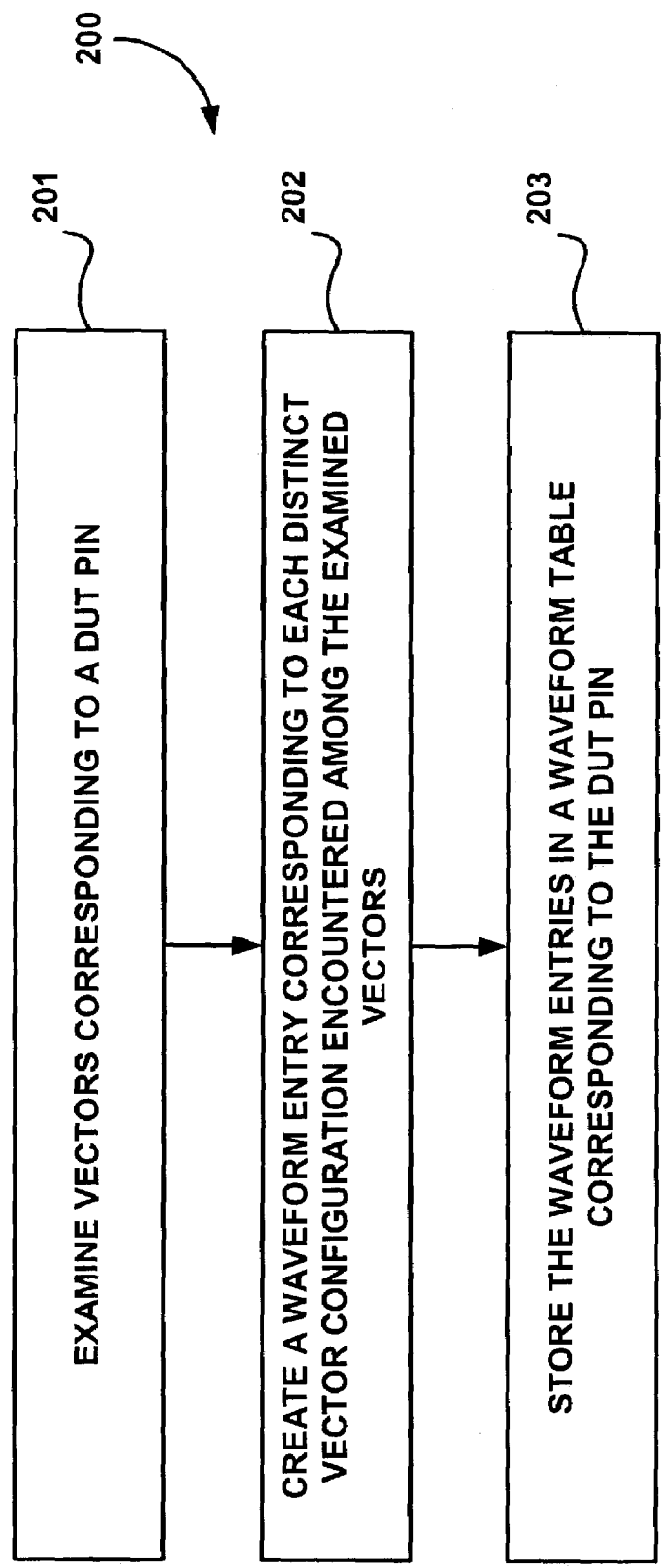
FIG. 2 is a flow chart depicting an embodiment of a method for configuring the waveform table depicted in FIG. 1.

FIG. 2 is a flow chart depicting an embodiment of a method 200 for configuring a waveform table 108 (FIG. 1). Vectors corresponding to a DUT pin 110 are examined, as indicated in block 201. A waveform entry representing each distinct vector configuration (encountered among the examined vectors) is created, as indicated in block 202. The waveform entries are stored in a waveform table corresponding to the DUT pin 110, as indicated in block 203. The waveform table may then be used to provide input to the DUT pin 110 and/or to provide data that is compared to the output of the DUT pin 110, as described, for example, in reference to FIGS. 3 and 5.

As a non-limiting example, assume that the following string of characters corresponds to input that is to be provided to a DUT pin 110:

TABLE 1

String Of Characters

1110100000000011110000110110101000000000000000000000000000001

The string of characters in Table 1 may be converted to the following three-character vectors:

TABLE 2

Three-Character Vectors 111, 010, 000, 000, 000, 111, 100, 001, 101, 101, 010, 000, 000, 000, 000, 000, 000, 000, 000, 000, 01X A waveform entry may then be created for each distinct vector configuration encountered among the vectors in Table 2. The distinct vector configurations are as follows:

TABLE 3

Distinct Vector Configurations 111, 101, 100, 000, 001, 010, 01X

In the above example, waveform entries would not be created for the possible vectors 110 and 011, since such vectors were not encountered among the examined vectors.

In cases where the input to a DUT pin 110 is more complex, the method 200 may be used to create a limited number of waveform entries representing a very small fraction of the number of possible waveform entries.

If the number of waveform entries corresponding to a waveform table 108 exceeds a predetermined limit, or if the waveforms entries would otherwise overwhelm resources of the error detection system 104, then waveform entries corresponding to the least encountered type of vectors may be eliminated accordingly (e.g., until the number of waveform entries is equal to the predetermined limit). Alternatively, or additionally, the size of the waveform entries may be reduced to correspond to smaller vectors (i.e., vectors having fewer state characters). For example, if using three-character vectors results in a number of waveform entries that exceeds the pre-determined limit, then two-character vectors may be used instead.

Figure 3:
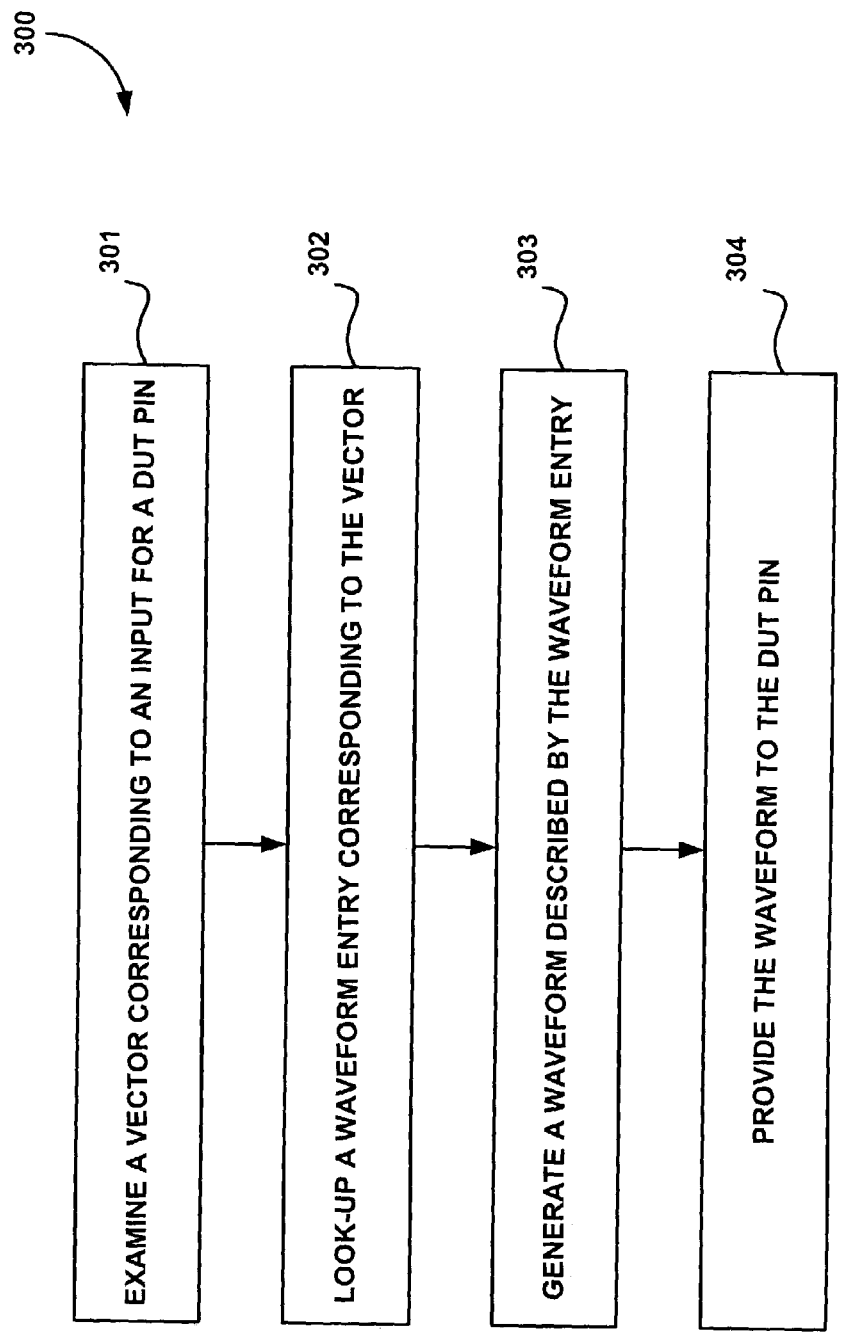
FIG. 3 is a flow chart depicting an embodiment of a method for using the waveform table 108 depicted in FIG. 1.

FIG. 3 is a flow chart depicting an embodiment of a method 300 for using a waveform table 108 (FIG. 1). As indicated in block 301, a vector corresponding to an input for a DUT pin 110 is examined. A waveform entry corresponding to the vector is then looked-up, as indicated in block 302, and a waveform identified by the waveform entry is generated, as indicated in block 303. The generated waveform is then provided to the DUT pin 110, as indicated in block 304.

Figure 4:
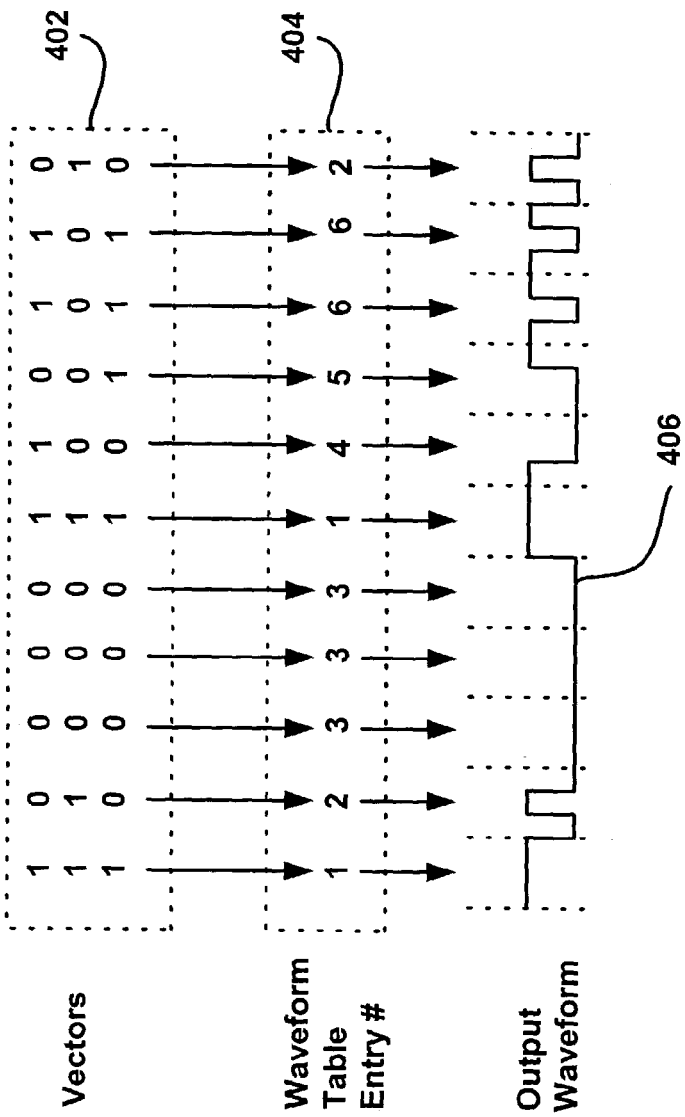
FIG. 4 provides an example of a waveform that is constructed using the waveform table depicted in FIG. 1.

FIG. 4 provides an example of a waveform 406 that is constructed responsive to input vectors 402. Each of the input vectors 402 is mapped to a waveform entry 404 in a waveform table 108 (FIG. 1). Then each waveform entry 404 is used to generate a corresponding portion of a waveform 406. Each portion of the waveform 406 (other than an initial portion) is output at a predetermined time after an immediately preceding portion of the waveform 406 to ensure continuity of the waveform 406. The waveform 406 may then be provided to the DUT 106 (FIG. 1) or may be compared with a waveform received from the DUT 106, depending on whether the input vectors 402 correspond to DUT input or DUT output.

Figure 5:
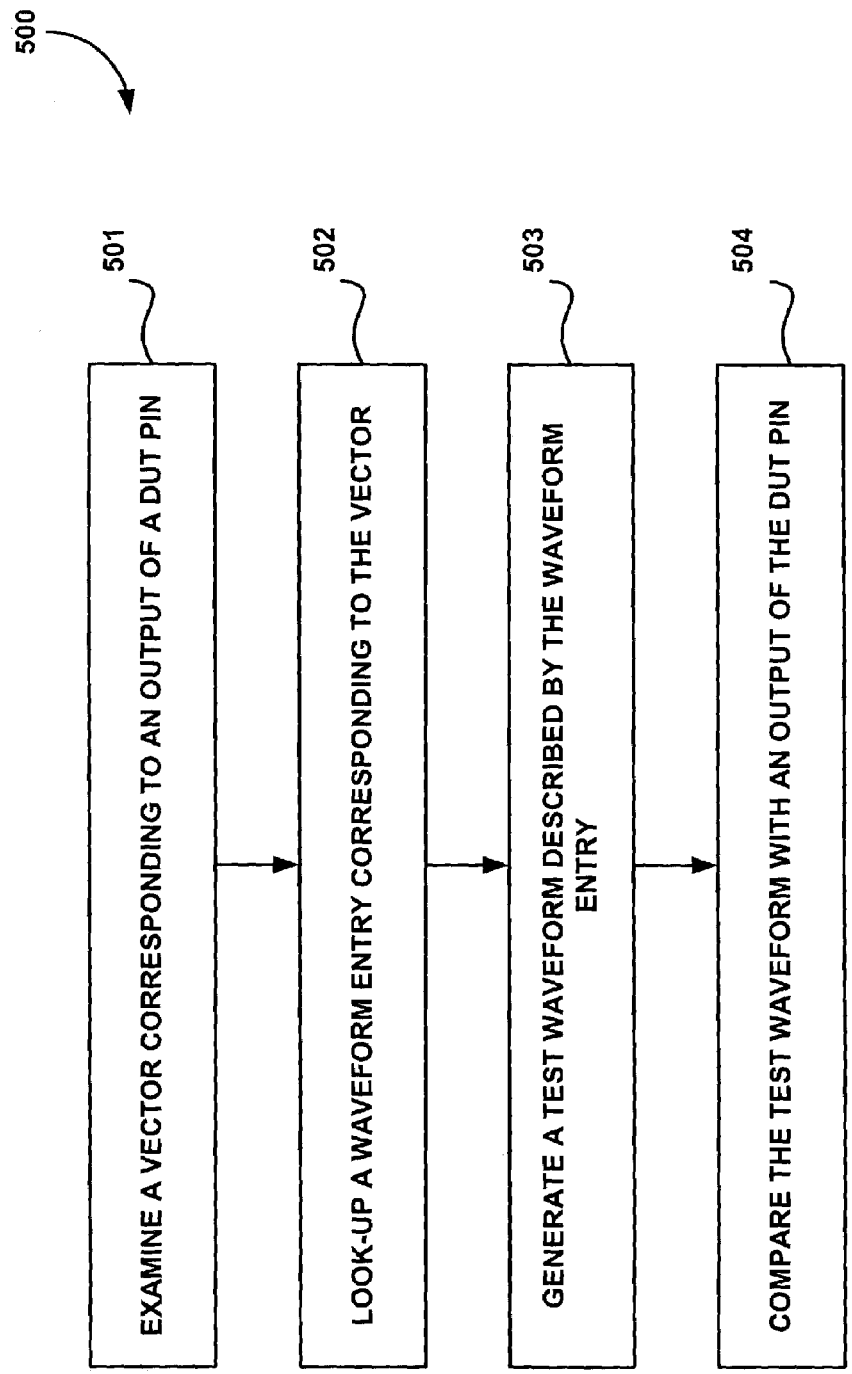
FIG. 5 is a flow chart depicting an embodiment of another method for using the waveform table 108 depicted in FIG. 1.

FIG. 5 is a flow chart depicting an embodiment of another method 500 for using a waveform table 108 (FIG. 1 ). As indicated in block 501, a vector corresponding to an output of a DUT pin 110 is examined. A waveform entry corresponding to the vector is then looked-up using the waveform table 108 (FIG. 1 ), as indicated in block 502, and a test waveform identified by the waveform entry is generated, as indicated in block 503. The test waveform is then compared with an output of the DUT pin 110, as indicated in block 504. By comparing the test waveform with an output of the DUT pin 110, possible errors in the performance of the DUt 106(FIG. 1)may be detected.

Figure 6:
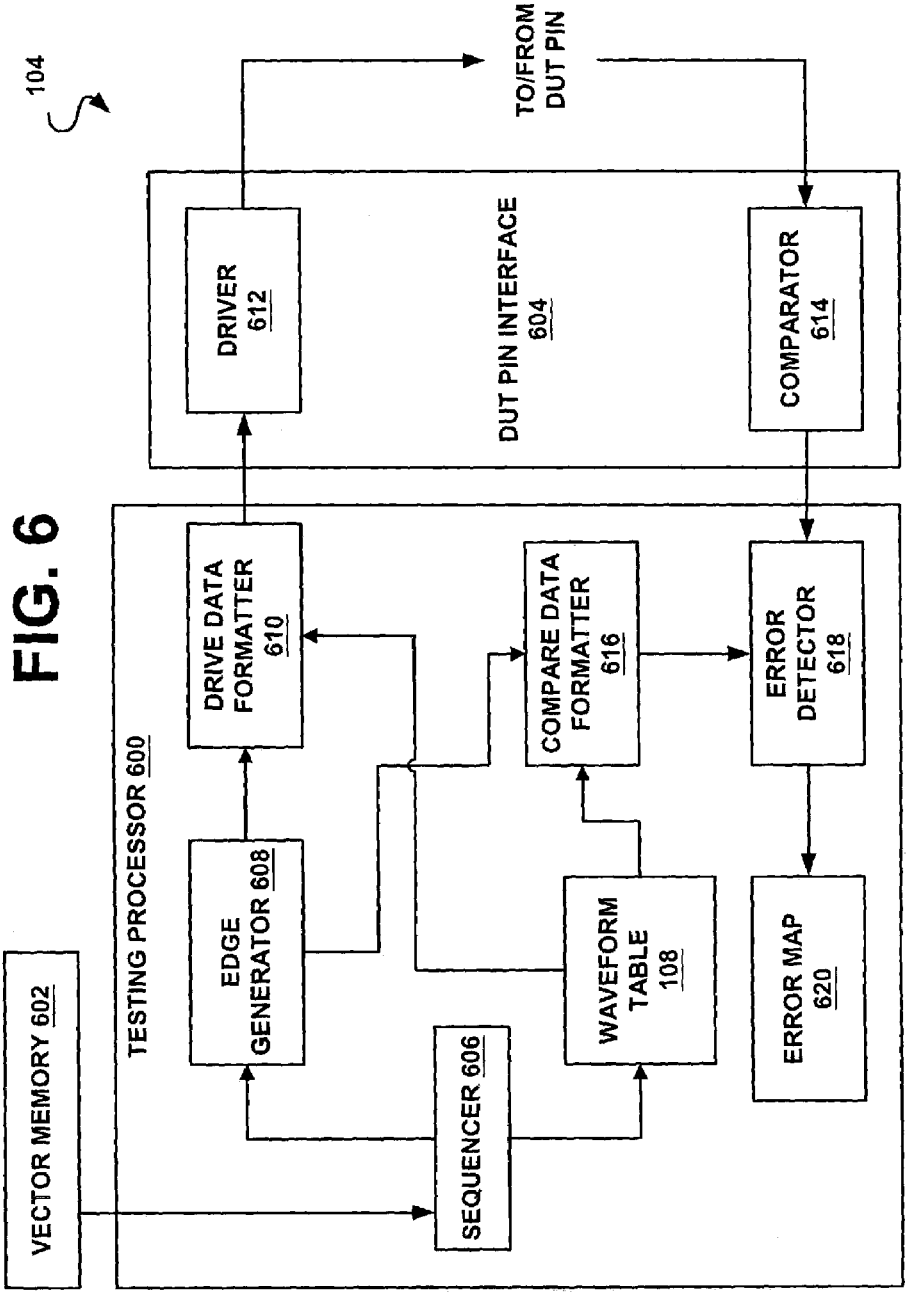
FIG. 6 is a block diagram depicting an embodiment of the error detection system depicted in FIG. 1.

FIG. 6 is a block diagram depicting an embodiment of an error detection system 104. The error detection system 104 includes the testing processor 600, the vector memory 602, and the DUT pin interface 604. The vector memory 602 stores test data that is to be used for testing the DUT 106 (FIG. 1). The DUT pin interface 604 provides input test signals to and/or receives output test signals from a certain DUT pin 110. The testing processor 600 converts test data received from the vector memory 602 into input and/or output waveforms.

The sequencer 606 sequentially retrieves vectors (e.g., character sequences) from the vector memory 602, causes the waveform table 108 to output respective waveform data, and causes the edge generator 608 to output respective timing information.

If a vector retrieved from the vector memory 602 represents data that is to be provided to the DUT pin 110, then the drive data formatter 610 formats a waveform using the waveform data and timing information (provided by the waveform table 108 and the edge generator 608, respectively). The drive data formatter 610 then provides the formatted waveform to the driver 612 which outputs the formatted waveform to the DUT pin 110.

If a vector retrieved from the vector memory 602 corresponds to data that is to be received from the DUT pin 110, then the compare-data formatter 616 formats a waveform using the waveform data and timing information (provided by the waveform table 108 and the edge generator 608, respectively). The compare-data formatter 616 then provides the formatted waveform to the error detector 618. The error detector 618 compares the formatted waveform to a corresponding waveform received from the DUT pin 110. Differences between the formatted waveform and the corresponding waveform received form the DUT pin 110 represent errors in the performance of the DUT 106. Information about such errors is stored in the error map 620.

Figure 7:
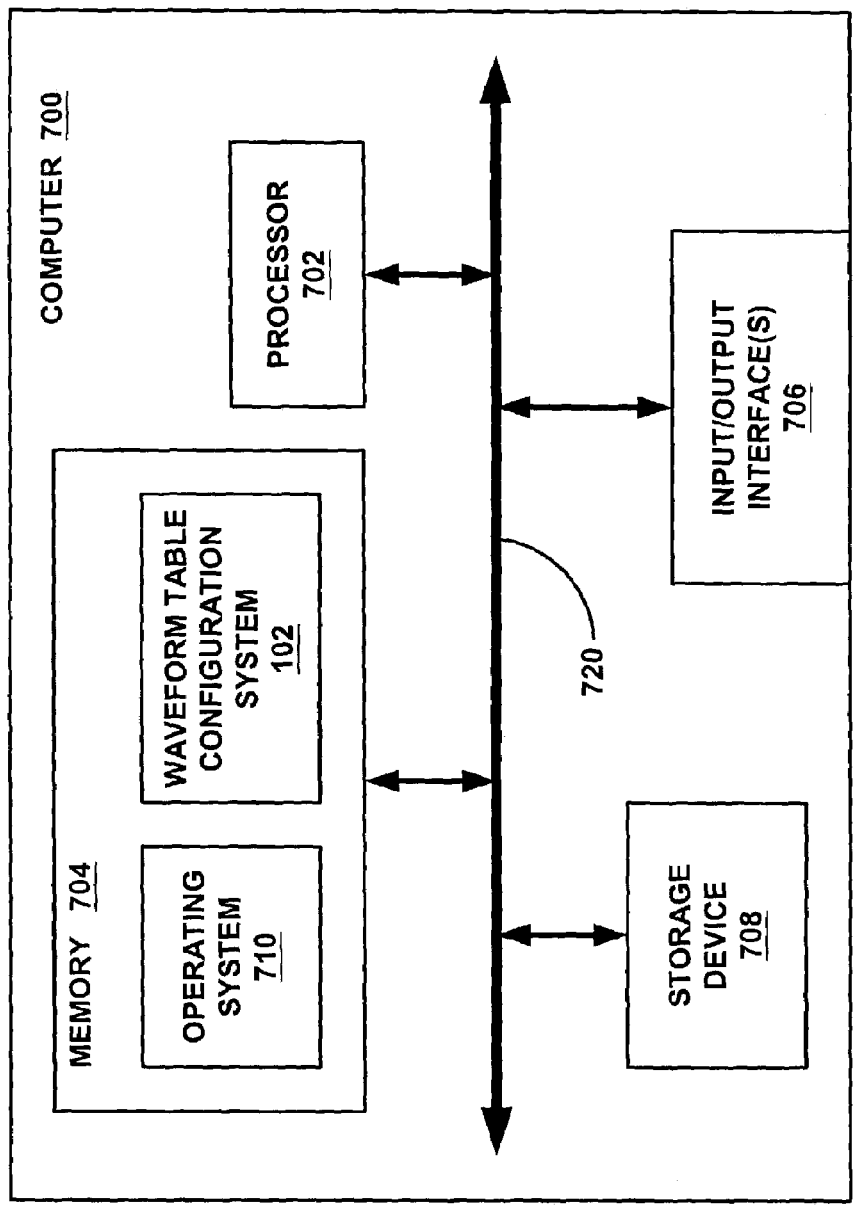
FIG. 7 is a block diagram depicting an embodiment of a computer that can be used to create entries for the waveform table depicted in FIG. 1.

FIG. 7 is a block diagram depicting an embodiment of a computer 700 that can be used to create entries for a waveform table 108 (FIG. 1). Generally, in terms of hardware architecture, as shown in FIG. 7, the components of the computer 700 include a processor 702, memory 704, input/output (I/O) interfaces 706, and a storage device 708. These components (702, 704, 706, and 708) may be communicatively coupled via a local interface 720, which may comprise, for example, one or more buses or other wired or wireless connections. The local interface 720 may have additional elements, which are omitted for simplicity, such as controllers, buffers (caches), drivers, repeaters, and receivers, to enable communications.

The processor 702 is a hardware device for executing software, particularly that stored in memory 704. The processor 702 can be any custom made or commercially available processor, a central processing unit (CPU), an auxiliary processor among several processors associated with the computer 700, a semiconductor based microprocessor (in the form of a microchip or chip set), or generally any device for executing software instructions. When the computer 700 is in operation, the processor 702 is configured to execute software stored within the memory 704, to communicate data to and from the memory 704, and to generally control operations of the computer 700 pursuant to the software.

The I/O interfaces 706 may be used to communicate with one or more peripheral devices including, for example, a printer, a copier, a keyboard, a mouse, and/or a monitor, etc. The I/O interfaces 706 may include, for example, a serial port, a parallel port, a Small Computer System Interface (SCSI), an IR interface, an RF interface, and/or a universal serial bus (USB) interface.

The memory 704 can include any one or combination of volatile and/or non-volatile memory elements now known or later developed. For example, the memory 704 may comprise random access memory (RAM), read only memory (ROM), a hard disk, a tape, and/or a compact disk ROM (CD-ROM), among others. Note that the memory 704 can have a distributed architecture, where various components are situated remote from one another, but can be accessed by the processor 702.

The software applications in memory 704 include an operating system (OS) 710 and the waveform table configuration system 102. The OS 710 essentially controls the execution of the other applications, and provides scheduling. input-output control, file and data management, memory management, and/or communication control, among other functionality. The waveform table configuration system 102 may be used to create waveform entries that are to be exported to an error detection system 104 (FIG. 1), where they are stored in a waveform table 108. The waveform table configuration system 102 may be a source program, an executable program (e.g., object code), a script, or any other entity comprising a set of instructions to executed.

The waveform table configuration system 102 can be embodied in any computer-readable medium for use by or in connection with an instruction execution system, apparatus, or device, such as a computer-based system or a processor-containing system. In the context of this disclosure, a "computer-readable medium" can be any means that can store, communicate, propagate, or transport a program for use by or in connection with the instruction execution system, apparatus, or device. The computer-readable medium can be, for example, among others, an electronic, magnetic, optical, electromagnetic, infrared, or semiconductor system, apparatus, device, or propagation medium now known or later developed.

What is claimed is:

1. A method for preparing a waveform used for testing a device-under-test (DUT), the method comprising:
providing a string of characters corresponding to a DUT pin;
converting the string of characters into a plurality of vectors, each vector including a plurality of characters and having a predetermined length; and
creating waveform entries, each of the waveform entries corresponding to a vector configuration that is distinct from the other waveform entries, wherein the vector configuration is associated with a specific pattern of characters.

2. The method of claim 1, further comprising:
storing each waveform entry in a waveform table corresponding to a DUT pin.

3. The method of claim 2, further comprising:
using the waveform entries in the waveform table to generate waveforms identified by the respective waveform entries.

4. The method of claim 3, further comprising:
providing the generated waveforms to the DUT via the DUT pin.

5. The method of claim 3, further comprising:
comparing the generated waveforms with waveforms received from the DUT via the DUT pin.

6. The method of claim 5, further comprising:
determining errors in DUT performance based on a comparison of the generated waveforms with waveforms received from the DUT via the DUT pin.

7. The method of claim 6, further comprising:
storing information about the errors in memory.

8. A system for testing of a device-under-test (DUT), the system comprising:
a first memory device for storing a plurality of vectors, each of the vectors comprising multiple characters and having a predetermined length; and
a processor that is programmed to:
examine the plurality of vectors, and
create waveform entries, each of the waveform entries corresponding to a vector configuration encountered among the vectors examined;
wherein the vector configurations are associated with a specific pattern of characters; and
wherein each vector configuration is distinct from the other vector configurations.

9. The system of claim 8, further comprising:
a second memory device for storing the waveform entries.

10. The system of claim 8, wherein the DUT comprises a plurality of pins for receiving respective input data and providing respective output data.

11. The system of claim 10, further comprising a plurality of memory devices, each of the memory devices being used to store a plurality of multi-character vectors corresponding to a respective pin among the plurality of pins.

12. A system for preparing a waveform for testing a device-under-test (DUT), the system comprising:
means for providing a string of characters corresponding to a DUT pin;
means for converting the string of characters into a plurality of vectors, each vector including a plurality of characters and having a predetermined length; and
means for creating waveform entries, each of the waveform entries corresponding to a vector configuration that is distinct from the other waveform entries, wherein the vector configuration is associated with a specific pattern of characters.

13. The system of claim 12, further comprising:
means for storing each of the waveform entries in a waveform table corresponding to a DUT pin.

14. The system of claim 13, further comprising:
means for providing to the DUT pin waveforms identified by respective waveform entries in the waveform table.

15. A method for testing performance of a device-under-test (DUT), the method comprising:
examining a vector, the vector including a plurality of characters corresponding to a DUT pin;
determining if the vector is identified in a list of vectors, each vector of the list of vectors having a pattern of characters that is different from the pattern of characters of the other vectors;
responsive to determining that the examined vector is not identified in the list of vectors, adding an entry in the list of vectors identifying the vector examined;
communicating the list of vectors to a device to test the performance of the DUT.

16. The method of claim 15, further comprising:
storing the list of vectors in a memory device corresponding to a pin of the DUT.

17. The method of claim 16, further comprising:
generating waveforms corresponding to respective vectors identified in the list of vectors.

18. The method of claim 17, further comprising:
providing the generated waveforms to the DUT via the pin.

19. The method of claim 17, further comprising:
comparing the generated waveforms with respective waveforms received from the DUT via the pin.

* * * * *